United States Patent [19]
Liu et al.

[11] Patent Number: 5,912,836
[45] Date of Patent: Jun. 15, 1999

[54] CIRCUIT FOR DETECTING BOTH CHARGE GAIN AND CHARGE LOSS PROPERTIES IN A NON-VOLATILE MEMORY ARRAY

[75] Inventors: David K. Y. Liu; Kou-Su Chen, both of Fremont, Calif.

[73] Assignee: AMIC Technology, Inc., Santa Clara, Calif.

[21] Appl. No.: 08/982,204

[22] Filed: Dec. 1, 1997

[51] Int. Cl.$^6$ .................................................. G11C 16/04
[52] U.S. Cl. ............................... 365/185.01; 365/185.09; 365/185.24
[58] Field of Search ..................... 365/230.01, 185.09, 365/185.01, 182, 185.24

[56] References Cited

U.S. PATENT DOCUMENTS

| | | | |
|---|---|---|---|
| 5,005,155 | 4/1991 | Radjy et al. ............................. | 365/185 |
| 5,434,824 | 7/1995 | Harari ..................................... | 365/185 |
| 5,579,259 | 11/1996 | Samachisa et al. ................. | 365/185.14 |
| 5,640,344 | 6/1997 | Pani et al. ................................ | 365/182 |
| 5,642,311 | 6/1997 | Cleveland et al. ................... | 365/185.3 |
| 5,719,520 | 2/1998 | Au et al. ............................. | 365/185.01 |

*Primary Examiner*—David Neims
*Assistant Examiner*—David Lam
*Attorney, Agent, or Firm*—Law+

[57] ABSTRACT

A test circuit for observing charge retention characteristics of cells in a flash memory array is disclosed. Unlike prior art structures, the present circuit monitors both charge loss and charge gain of cells in the array. In this way, cells having conduction thresholds below a desired target threshold and cells having conduction thresholds above a desired target threshold can both be observed. The circuit includes a regular memory array, and a mirror array formed with devices having opposite channel types to the regular array. By identifying and evaluating more accurately the threshold characteristics of a particular cell design or cell process, improvements can be made to such designs and processes in a more rapid and optimal fashion.

30 Claims, 4 Drawing Sheets

Flash Array in NWell

Flash Array in NWell

CIRCUIT FOR DETECTING BOTH CHARGE GAIN AND CHARGE LOSS PROPERTIES IN A NON-VOLATILE MEMORY ARRAY

FIELD OF THE INVENTION

The invention relates generally to integrated circuit development and manufacturing tools for facilitating the design and testing of selected semiconductor structures. The present invention has specific applicability to test structures that are capable of detecting both charge gain and charge loss properties in an array of Flash EPROM memory cells or other programmable logic cells.

BACKGROUND OF THE INVENTION

In the design of semiconductor devices, it is often advantageous (if not necessary) to monitor the behavior of some physical property of such device to characterize and thus determine whether a particular physical implementation is superior to another implementation. A substantial amount of research and effort is invested and undertaken by design and process engineers simply to create better, simpler, and more accurate test vehicles for observing the characteristics of a proposed design. The monitoring of device behavior and characteristics is done in a variety of ways, and one common method practiced today includes the use of test structures which are used either (or sometimes both) in the design and manufacturing of the devices in question. These test structures are usually implemented directly on the same substrate as the device under investigation, and are configured to be more easily accessible for measuring the property of interest.

An example of this is the threshold voltage of a Flash memory cell. This voltage is widely considered as the most critical parameter in determining the memory state that is being stored by the cell. The threshold voltage is controlled by the amount of charge that is placed on the floating gate of the Flash memory cell. In other words, this voltage is a direct function of the amount of charge stored within a particular cell. During the operation of the memory cells in an array, the floating gate for a given cell can inadvertently gain or lose charge. This unintentional charge gain or charge loss can change the memory state of the cell and become a cause of reliability failure in the Flash memory array. It is crucial to have a good monitor of this behavior for a large array of memory cells in a given Flash memory technology. As is also apparent, as the number of memory cells increases for a particular device, the expected variations between poor charge storing devices (leaky bits) and poor charge discharging devices (stubborn bits) are going to increase. For this reason, a testing mechanism which leads to more tightly controlled charge distribution populations is highly useful.

The most straightforward method to evaluate the charge-gain/charge-loss behavior of a device is to monitor the threshold voltage of each cell in the large memory array. This is often not convenient since it involves the use of a fully functional circuit onboard the device with all the proper decoding to address and access each individual cell in the memory array. However, this solution is not extremely practical from a functional or manufacturing perspective. It is substantially more useful for the population characteristics to be observed prior to the release of such device for use, and some manufacturing test procedures are known in the art for monitoring the devices as they are manufactured in a fabrication facility. Even this approach, however, is non-optimal, and for that reason, some degree of device behavior is both simulated and tested during the design phase of a particular flash cell, so that the charge population distribution of a particular physical cell implementation can be measured and controlled before full scale manufacturing is undertaken using such implementation.

Accordingly, it has become common in the industry to try and monitor the charge-gain/charge-loss behavior to evaluate the feasibility and reliability of an unproven Flash technology, prior to committing the design of a full functional circuit. In previous test structures of this type, an array of Flash EPROM memory cells are all connected together to provide a simple way of evaluating the behavior of the memory cell population. One drawback of this approach is that it is often capable of only evaluating the charge loss behavior of the memory array. The monitor of the charge gain behavior still has to resort to the use of a full functional memory array circuit. In such contexts, while it has been hitherto impossible, it would be very desirable to have a simple test structure capable of monitoring both the charge gain and charge loss behavior, without the use of full functional circuit.

FIG. 1 illustrates a test structure in the prior art that is capable of only monitoring the charge loss behavior. This structure typically consists of many cells (100, 101, 102, etc.) with a shared gate 100a, shared drain 100b, and shared source 100c. If all the cells are fixed at a same threshold voltage, the sub-threshold characteristics of the array will be equivalent to the sub-threshold characteristics of a single cell having a size equal to the total aggregate width of all the cells in the array. FIG. 2A illustrates an approximate graphical depiction of the sub-threshold behavior of an array with all the cells fixed at the same threshold voltage. (It should be noted that the Y-axis on the curve is in logarithmic scale.)

As is to be expected as a consequence of normal manufacturing variations, however, in the population of cells there will be cells having slightly different floating gate charge retention characteristics. This is inevitable given typical semiconductor processes which result in slightly different floating gate sizes, thicknesses, coupling to source/drains, etc. Thus, it is expected that there will be some random distribution (rather than a fixed or completely uniform distribution) of cell charge characteristics, with some being below a target charge retention characteristic, and some being above such target.

Accordingly, if a single cell in the test array experiences significant charge loss and results in a lower threshold voltage, the sub-threshold characteristics of the array will exhibit a different behavior than that expected for a completely uniform distribution. FIG. 2B illustrates a situation where a small number of cells are leaky (i.e., they have lost some charge) which results in a lower threshold voltage for such cells. These cells conduct current at a lower gate voltage $V_L$ before the main array begins to conduct current at a target gate voltage $V_{target}$. The resulting sub-threshold characteristics will show a kink in the overall I–V curve, as illustrated in FIG. 2B. An observation of the heavy solid line of FIG. 2B, therefore, permits designers and manufacturers of flash cells to see and directly observe the size of this population, and study their characteristics, so that improvements (i.e., adaptations and refinements) can be made to the cell structure, or to the cell manufacturing process.

Through such improvements, of course, the cell populations should become more uniform and thus result in improved performance of devices utilizing such structures and processes. This is because the more uniform the distribution of cell charge populations (i.e., the more each cell is made to be identical to every other cell in the array) the more likely it is that various electrical operations occurring during the normal use of such cells in actual devices (such as erase and program) are going to be implemented correctly and successfully for each cell in the array.

In examining the solid line portion of the graph in FIG. 2B, however, it is apparent that users of such test structures are only able to glean information from one segment of the defective cell population. If, for example, some of the cells in this test structure array start to gain charge on their respective floating gate (as would be expected again as a result of manufacturing variations or as a result of defects and damage caused by operational stress), it will result in these cells having higher threshold voltages. These cells will start conduction at a higher gate voltage $V_H$ than the rest of the population. As shown in FIG. 2B, however, their contribution to the characteristics will not be noticed. This is because by the time these cells start to conduct a very small amount of subthreshold current, the rest of the population together, having a lower threshold voltage, will be conducting a current that is at least a few orders of magnitude higher than these cells. Thus, the charge gain behavior of cell populations in a Flash memory array cannot be observed using this kind of traditional test structure. This is true even though it is conceivable that the cell charge retention characteristics of a particular structure and process implementation may tend to result in a larger relative population of charge gainers versus charge losers.

Accordingly, a design that appears otherwise acceptable based on observations of prior art test structures may in fact have substantial charge gain defects that would go undetected. What is needed is an extension of the test structure to include the capability of evaluating the charge gain behavior, so that the true properties of various cell designs and processing techniques can be more accurately determined.

SUMMARY OF THE INVENTION

An object of the present invention, therefore, is to provide a test structure that is capable of evaluating and monitoring the charge-gain and charge-loss behavior of a flash memory array.

Another object of the present invention is to provide a test structure that permits designers and manufacturers of flash memory cells to better optimize cell designs and cell manufacturing techniques so that improved cell charge retention characteristics are achieved resulting in correspondingly improved cell voltage threshold populations.

A further object of the present invention is to provide a test structure that eliminates the need for a full function circuit to access each individual cell later in an actual device.

Yet another object of the present invention is to provide flash cell architecture designers, flash cell process designers and flash cell manufacturers with a method for evaluating and controlling the distribution of cell charge characteristics during design, test and manufacturing of such cells.

Another object of the present invention is to provide a method for manufacturing flash cells which results in more uniform voltage threshold characteristics so that operation of such devices is improved.

These and other objects are effectuated by the present invention, which includes a circuit for observing charge retention characteristics of cells in a memory array. A first portion of the circuit is used for monitoring charge loss of any of the cells while a second portion monitors charge gain of any of the cells. In this way, cells having conduction thresholds below a desired target threshold and cells having conduction thresholds above a desired target threshold can both be observed. The first portion of the circuit can be activated during a first period for observing cells having conduction thresholds below the target threshold, and the second portion can be activated during a second period for observing cells having conduction thresholds above the target threshold. In a preferred embodiment, the first and second portions are isolated from each other to ensure more accurate modeling.

Structurally, the first portion of the circuit is comprised of a number of flash cells each having a floating gate and a first type conductivity channel, and the second portion is comprised of a number of flash cells each having a floating gate and a second type conductivity channel opposite that of the first conductivity channel. The cells in both arrays have their own common sources, common drains, and common gates.

Corresponding ones of the floating gates of the first and second portions are connected to each other, which permits the evaluation of the charge-gain behavior. The first portion is a regular n-channel array, and the second portion is a mirror p-channel array which is inactivated except during testing of the n-channel array. In this manner, cells having conduction thresholds below the target threshold are observed during a first period in which only the n-channel devices are activated, and cells having conduction thresholds above the target threshold are observed during a second period in which only the p-channel devices are activated.

It can be seen that the present invention permits a more accurate evaluation of cell population voltage threshold distributions. The distribution can be studied to determine both positive and negative deviations between the actual cell voltage thresholds and target thresholds so that adjustments can be made during a design phase to a cell structure or cell process to minimize such deviations and therefore effectuate a more uniform distribution of voltage thresholds for said cells.

The invention is also useful during manufacture of a memory array using non-volatile memory cells, because cell population voltage threshold distributions can be improved by identifying and discarding defective cells. The regular array and a mirror array can be formed in the same substrate. In a later test stage of manufacturing, the voltage thresholds of the cells (i.e., whether they are above or below the target threshold) can be measured and evaluated to identify such defective cells. Integrated circuits made using such manufacturing processes will exhibit minimized threshold deviations and better performance and reliability since they will effectuate a more uniform distribution of voltage thresholds for the cells in the array.

DETAILED DESCRIPTION OF THE INVENTION

To evaluate the charge gain behavior of cells in a Flash memory array, the applicants have devised a mechanism so that conduction for such cells initiates only at a higher threshold voltage. In another words, a physical phenomenon is selected wherein the device conduction is stronger when the floating gate potential is more negative, rather than more positive. A P-channel transistor exactly fits this type of conduction mechanism, in that a P-channel transistor conducts more current when the gate voltage is more negative with respect to the channel potential. For various reasons, however, a pure P-channel Flash cell would not be suitable to evaluate the charge-gain/charge-loss property, since a P-channel Flash cell by itself would most likely require a different set of program/erase mechanisms, and for that reason is likely to be incompletely correlated in behavior during normal operation with typical N-channel devices. Due to the different mechanisms used, the result might not be easily translated and be applicable to actual program/erase conditions an actual product array will experience, thus rendering the test results meaningless.

Figure 1:
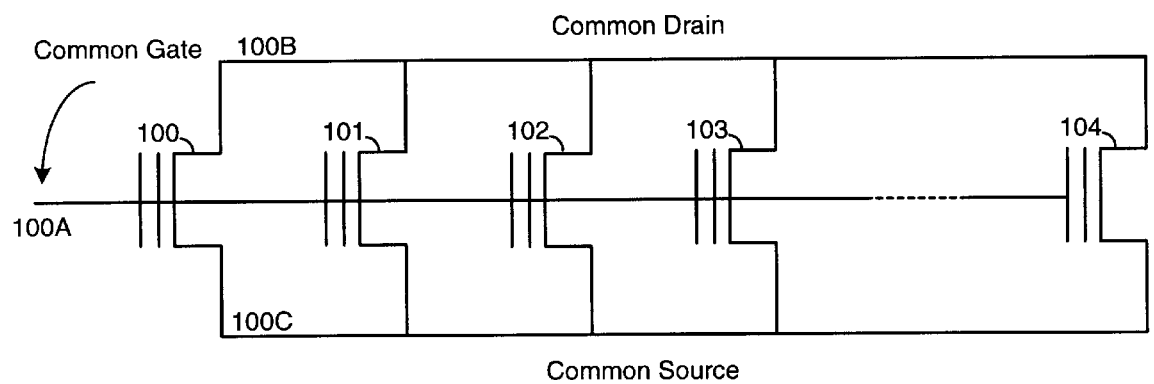
FIG. 1 is a depiction of a prior art test structure for monitoring charge loss behavior of an array of flash memory cells.
Figure 2A:
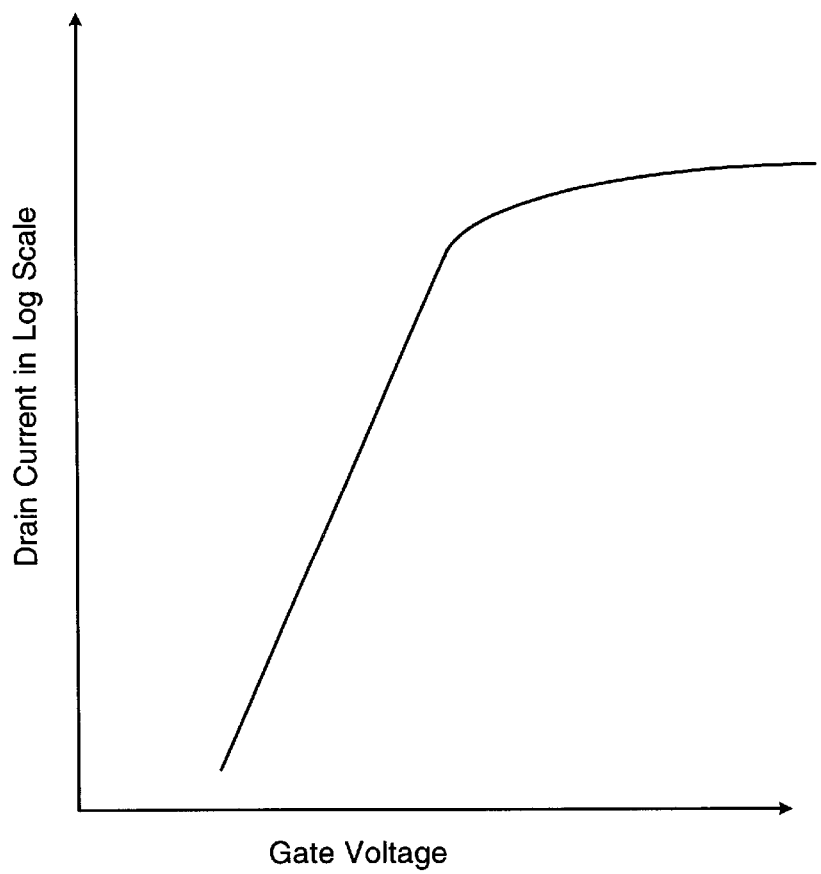
FIG. 2A is a graphical illustration of an I–V curve for an ideal array of memory cells which have a single, uniform target voltage threshold.
Figure 2B:
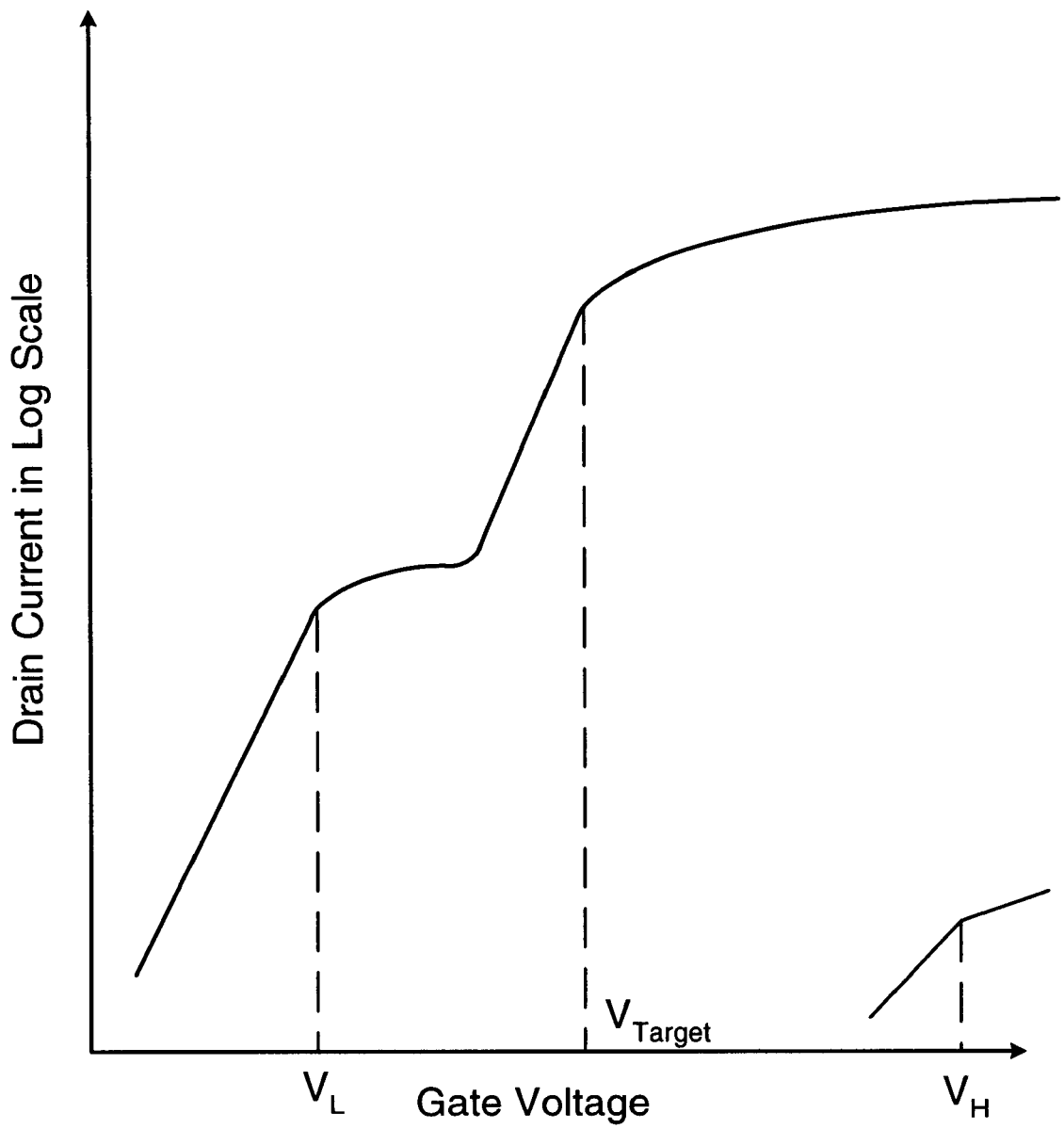
FIG. 2B is a graphical illustration of an I–V curve for an actual array of memory cells in which a noticeable portion of such cells have either a sub-target threshold voltage or an over-target threshold voltage.
Figure 3:
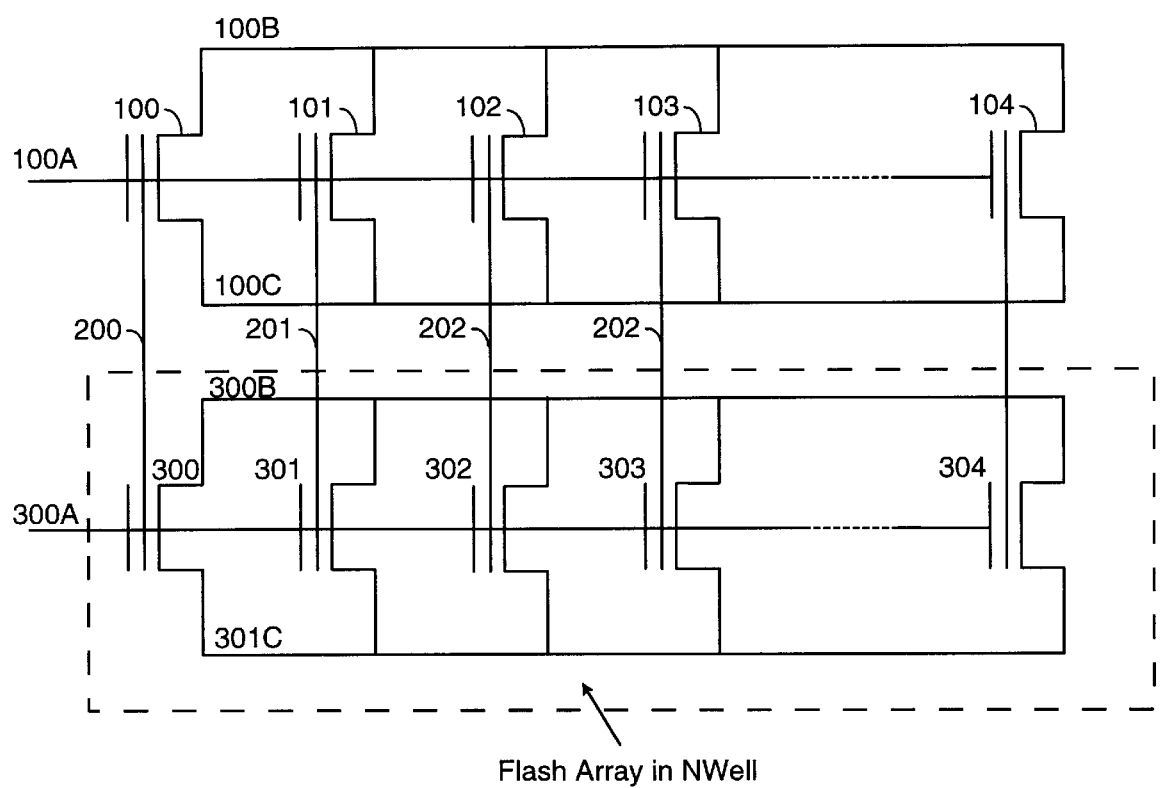
FIG. 3 is an electrical diagram of an embodiment of the present invention.

To overcome these roadblocks, the present invention uses the circuit shown in FIG. 3. As shown, there are two separate arrays: a regular, typical flash array inside the P-substrate (or P-well), and a mirror array inside an N-Well. These two arrays generally correspond to a first portion (N-channel) which, when activated, monitors charge loss of any of the cells, and a second portion (P-channel) for monitoring charge gain of any of said cells. Using these two test structures, the behavior of the entire array can be observed and more accurately characterized, because cells having conduction thresholds below a desired target threshold as well as cells having conduction thresholds above a desired target threshold can be identified.

From a structural perspective the present circuit shares some similarities with the prior art. The flash cells of the N-channel array have a common gate 100*a*, common source 100*b*, and a common drain 100*c*. Similarly, the flash cells of the mirror P-channel array have a common gate 300*a*, a common source 300*b* and a common drain 300*c*. These features make it possible to activate, cycle and stress all of the respective cells in each of these arrays simultaneously.

A key aspect of the present invention lies in the fact that floating gates of each Flash memory cell in the regular array (100, 101, etc.) are connected to corresponding floating gates of a corresponding cell (300, 301, etc.) in the mirror array. For ease of manufacturing, the source/drain implant of the mirror cell array inside the N-Well is implemented typically with a P+ implant. Thus the mirror cell array inside the N-Well is an array of P-channel Flash memory cells, but since they share their floating gates with the regular N-channel devices in the regular array, their electrical behavior is more closely reflective of the behavior of the N-channel devices.

To monitor both the charge loss and charge gain of the regular array, the following steps are taken. First, the N-channel array is cycled and stressed during a first period of time, so that a certain degree of charge is built up on the floating gates. During this first period, the P-channel array is left unconnected, and thus is not cycled or stressed. Following this step, the existence and behavior of cells in the regular N channel array having sub-threshold voltage characteristics can be determined in the same manner as previously performed in the prior art systems.

As explained above, during cycling and stressing of the regular array in the P-substrate, the mirror array inside the N-Well is not connected and has no impact on the regular array. During a third period, however, the P-channel devices are activated so that the identity and behavior of cells in the N-channel array which have higher threshold voltages can be monitored and measured. This part of the circuit performs this previously unavailable monitoring operation because of the following principle: if any cell inside the regular N channel array has a higher threshold voltage, then the potential on the floating gate for that cell will be more negative. The corresponding P-channel cell in the mirror array, which is connected through the common floating gate line, will be more conductive since its floating gate voltage is more negative with respect to the N-Well. Thus once the stress is done on the regular cell array, the mirror array is connected for charge gain evaluation while the regular array is left unconnected. The cell in the mirror array corresponding to the cell in the regular array with the most unintentional charge gain on its floating gate will conduct the most current.

Figure 4:
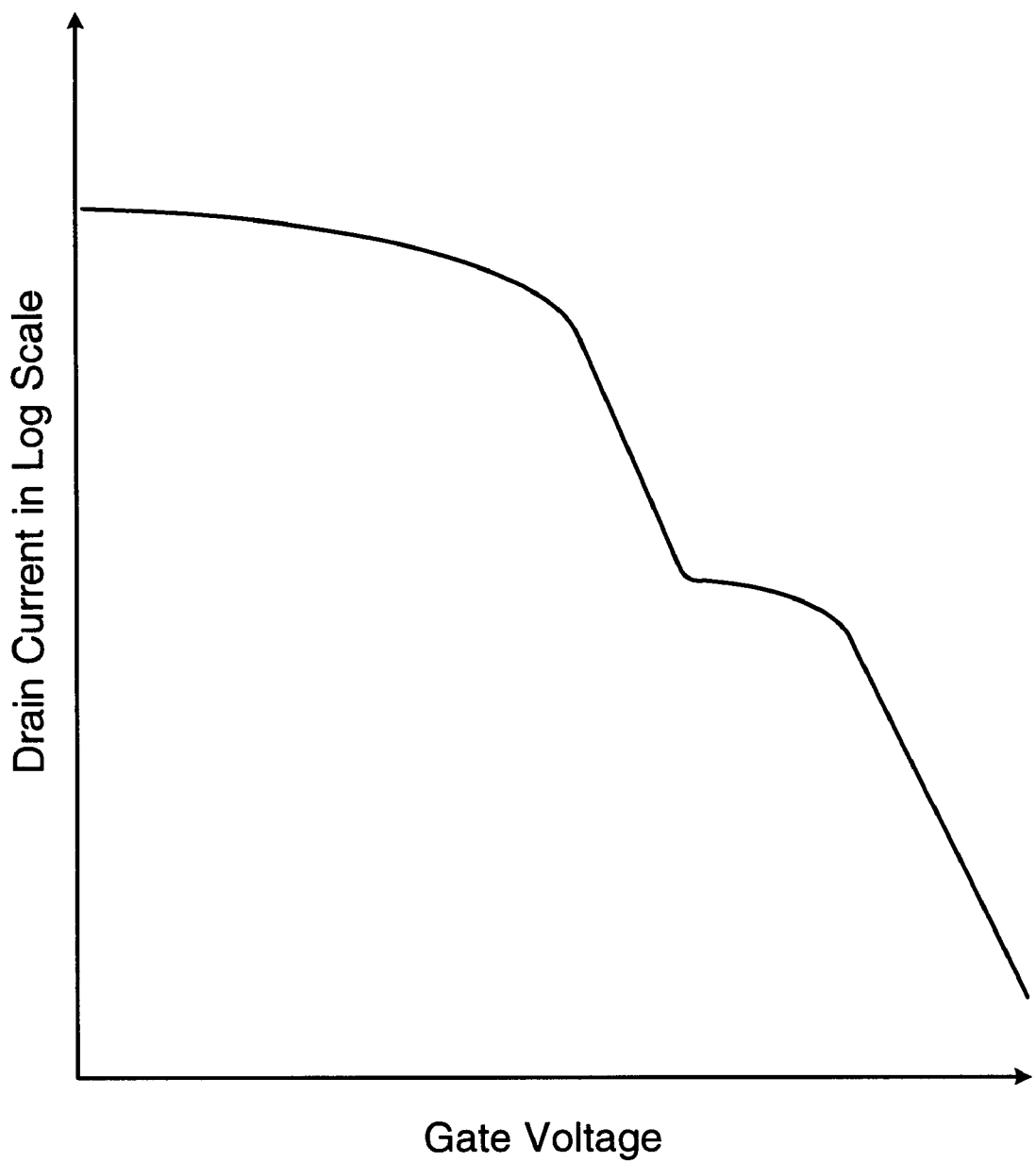
FIG. 4 is an I–V curve graphically illustrating how the present invention monitors charge gain behavior of flash memory cells.

FIG. 4 illustrates the characteristics that can be monitored and observed from the mirror array where a small number of cells in the regular array have gained some charge during the cycling or stressing conditions. These cells in the regular array have a higher threshold voltage than the rest of the population. Due to their higher threshold voltage, which is equivalent to a more negative floating gate potential, these cells in the mirror array will conduct first as the common control gate on the mirror array is ramped down from high positive voltage to negative voltage. In this fashion, the charge gain behavior of the regular array as a function of typical cycling conditions can be monitored and studied. It should be clear to those skilled in the art that with the mirror array unconnected, the test structure is just the same as in the one in the prior art. Thus the charge gain/loss behavior can be monitored by studying the actual regular array, and not a p-channel substitute that is likely to give inaccurate information. Thus, the circuit of the present invention has the unique capability to monitor both the charge gain and the charge loss behavior using a simple array test structure.

It can be further seen that the above circuit provides a more accurate evaluation of cell population voltage threshold distributions, heretofore unavailable since only one aspect of cell charge characteristics was easily determinable. By obtaining these distributions, both positive and negative deviations between cell voltage thresholds and target threshold can be measured. In this manner, cell structure designs, and cell manufacturing processes can be more accurately implemented because a more accurate test is available for measuring the true performance of such designs and processes.

This unique feature, therefore, permits the present invention to be used both at the development phase for designing the basic structures and processes for flash cells, as well as in the manufacturing phase as well. Since more accurate modeling is obtained for the behavior of the cells, it is easier to construct populations with tighter, more uniform voltage threshold distributions. The behavior of various combinations of cell structures and cell processes can be better characterized so that typical split lot testing will yield faster and more accurate information for proposed designs.

Similarly, in the manufacturing context, defective cells of both types (both leaky cells and stubborn cells) can be more easily identified. The regular array can be formed in a typical substrate, along with the second array of mirror cells. During a testing stage, cells having voltage thresholds either above or below a target threshold can be identified. Such cells can be disabled using conventional techniques, and replaced with repair cells so that the overall behavior of the array is improved. In some cases it may even be acceptable to include such testing and replacement capability onboard a fully functioning device in the field (after manufacture) as is known in the art. In this way, the cell voltage threshold optimization is performed dynamically, taking into consideration the fact that different cells may "age" differently and need replacement at different times.

In any event, finished integrated circuit articles embodying the present invention will exhibit superior performance since better, more uniform voltage threshold populations will be implemented during the manufacturing process.

The above test structure is provided merely by way of example, and is not intended to be limiting of the present invention in any respect. Other variations of the test structure for effectuating the same purpose will become apparent to those skilled in the art based on the discussion above. Furthermore, the sequence of steps for monitoring the charge-loss and charge gain is not critical, and can be performed in any order most suitable for the particular application.

It will also be appreciated by those skilled in the art that the above discussion can be applied to a number of different semiconductor manufacturing operations where considerations of charge-gain and charge loss are applicable, such as in EPROMs and the like. Also, it is apparent that the principles of the present invention could be used in any environment which would benefit from better control of voltage threshold characteristics of FETs. Accordingly, it is intended that the all such alterations and modifications be included within the scope and spirit of the invention as defined by the following claims.

What is claimed is:

1. A circuit for observing charge retention characteristics of cells in a memory array, said circuit including:
    a first portion for monitoring a total quantity of charge lost by a plurality of said cells; and
    a second portion for monitoring a total quantity of charge gained by said plurality of cells; and
wherein said circuit can be used for determining quantitatively how much said plurality of cells have inadvertently lost and/or acquired charge compared to a target charge state.

2. The circuit of claim 1, wherein the first portion can be activated during a first period for observing cells that have undesirably lost charge and thus have conduction thresholds below the target threshold, and the second portion can be activated during a second period for observing cells that have undesirably gained charge and thus have conduction thresholds above the target threshold.

3. The circuit of claim 1, wherein the plurality of cells are cycled and stressed before the charge loss and charge gain quantities are determined.

4. The circuit of claim 1, wherein the first portion is comprised of a number of first flash cells each having a floating gate and a first type conductivity channel, and the second portion is comprised of a number of second flash cells each having a floating gate and a second type conductivity channel opposite that of the first conductivity channel.

5. The circuit of claim 4, wherein the first flash cells of the first portion have a first common source, a first common drain, and a first common gate, and the second flash cells of the second portion have a second common source, a second common drain, and a second common gate.

6. The circuit of claim 5, wherein corresponding ones of the floating gates of the first and second portions are connected to each other.

7. The circuit of claim 4, wherein the floating gates of the first portion and second portion can be charged during a first period, the charge loss of said first flash cells can be monitored by activating the first portion during a second period, and the charge gain of said first flash cells can be monitored by activating the second portion during a third period.

8. The circuit of claim 1, wherein the first portion is a regular n-channel array, and the second portion is a mirror p-channel array which is inactivated except during testing of the n-channel array.

9. A circuit for evaluating actual voltage thresholds of a population of non-volatile memory cells relative to a target voltage threshold, said circuit including:
    a first portion for monitoring charge loss characteristics of a plurality of said cells, which charge loss characteristics are related to an inability of said plurality of cells to maintain charge needed for a target charge state; and
    a second portion for monitoring charge gain characteristics of a plurality of said cells which charge gain characteristics are related to said plurality of cells inadvertently storing charge in excess of that needed to maintain said target charge state;
    wherein said charge loss and charge gains characteristics permit an evaluation of the ability of said plurality of cells to maintain voltage thresholds substantially equal to said target voltage threshold.

10. The circuit of claim 9, wherein said evaluation can be performed for an entire cell population in a non-volatile memory array to create a memory cell voltage threshold distribution, which distribution can be used for determining both positive and negative deviations between said cell voltage thresholds and said target threshold.

11. The circuit of claim 10, wherein said evaluation can be used for minimizing such deviations and for effectuating a more uniform distribution of voltage thresholds for said cells.

12. The circuit of claim 10, wherein such circuit is used during manufacture of said memory array, and the cell population voltage threshold distribution can be used for determining which cells should be disabled.

13. The circuit of claim 10, wherein such circuit is used during operation of said memory array, and the cell population voltage threshold distribution can be used for determining which cells should be disabled.

14. A method of observing charge retent ion characteristics of cells in a memory cell, said method comprising the steps of:
    monitoring a total quantity of charge lost by a plurality of said cells; and
    monitoring a total quantity of charge gained by said plurality of cells; and
    wherein a quantitative determination can be made of how much charge said plurality of cells have inadvertently lost and/or acquired compared to a target charge state.

15. The method of claim 14, wherein cells that have undesirably lost charge and thus have conduction thresholds below the target threshold are observed during a first period, and cells that have undesirably gained charge and thus have conduction thresholds above the target threshold are observed during a second period.

16. The method of claim 14, wherein, each of said plurality of cells has a floating gate and a first type conductivity channel, and said total charge gain is monitored by observing current behavior of a second group of cells, each of the second group of cells having a floating gate and a second type conductivity channel opposite that of the first conductivity channel.

17. The method of claim 16, wherein the floating gates of said plurality of cells are cycled repeatedly during a first period, and said total charge loss of said plurality of cells is monitored by activating them during a second period, and said total charge gain of said plurality of cells is monitored by activating the second group of cells during a third period.

18. The method of claim 16 wherein said plurality of cells are in an n-channel array, and the second group of cells is in a mirror p-channel array which is unactivated except during testing of the n-channel array.

19. A method of evaluating actual voltage thresholds of a population of non-volatile memory cells relative to a target voltage threshold, said method comprising the steps of:

(a) monitoring which of said cells have voltage thresholds below said target voltage threshold by identifying any cells that are incapable of holding a target charge; and (b) monitoring which of said cells have voltage thresholds above said target voltage threshold by identifying any cells that accumulate charge in excess of said target charge;

wherein an evaluation can be made of the ability of said cells to maintain voltage thresholds equal to said target voltage threshold.

20. The method of claim 19, wherein said evaluation can be performed for an entire cell population in a non-volatile memory array to create a memory cell voltage threshold distribution, which distribution can be used for determining both positive and negative deviations between said cell voltage thresholds and said target threshold.

21. The method of claim 20, wherein said evaluation can be used for minimizing such deviations and for effectuating a more uniform distribution of voltage thresholds for said cells.

22. The method of claim 20, further including a step (c): determining which of said cells should be disabled based on the evaluation of the cell population voltage threshold distribution.

23. A method of making an array of flash memory cells in an integrated circuit, said method comprising the steps of:

(a) forming an array of said cells in said integrated circuit;

(b) forming a second array of mirror cells in said integrated circuit;

(c) monitoring charge loss characteristics of said array of cells by measuring whether said array of cells inadvertently maintains charge below that needed for a target threshold voltage; and (d) monitoring charge gain characteristics of said array of cells by measuring whether said array of cells inadvertently maintains charge in excess of that needed for said target threshold voltage, said charge gain monitoring being achieved by using the second array of mirror cells;

wherein during the making of said array an evaluation is made of the ability of said cells to maintain voltage thresholds substantially equal to said target voltage threshold.

24. The method of claim 23, wherein said evaluation comprises a collective cell population voltage threshold distribution, which distribution can be used for determining both collective positive and negative deviations between said cell voltage thresholds and said target threshold.

25. The method of claim 24, further including a step (e): determining which of said cells should be disabled based on the evaluation of the collective cell population voltage threshold distribution.

26. The method of claim 23, further including a step before step (d): cycling and stressing said cells.

27. An article of manufacture comprising:

an array of flash memory cells formed in an integrated circuit, each of the cells having a voltage threshold required to activate such cell; and wherein collective charge loss characteristics of said array of cells have been determined by measuring whether said array of cells inadvertently maintains charge below that needed for a target threshold voltage; and further wherein collective charge gain characteristics of said array of cells have been determined by measuring whether said plurality of cells inadvertently maintains charge in excess of that needed for said target threshold voltage.

28. The article of claim 27, wherein said article includes a number of defective flash cells that have been disabled based on their inability to maintain said target voltage threshold.

29. The article of claim 28, further including a step wherein said cell array is fabricated simultaneously with a mirror cell array structure, which mirror cell array is used for determining said collective charge gain characteristics.

30. The article of claim 27, wherein said array of cells has also been cycled and stressed before charge loss and charge gain characteristics were determined.

* * * * *